US012062536B2

United States Patent
Min et al.

(10) Patent No.: US 12,062,536 B2
(45) Date of Patent: Aug. 13, 2024

(54) AMORPHOUS CARBON FOR GAP FILL

(71) Applicant: Applied Materials, Inc., Santa Clara, CA (US)

(72) Inventors: Xiaoquan Min, Cupertino, CA (US); Kwangduk D. Lee, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 8 days.

(21) Appl. No.: 17/014,039

(22) Filed: Sep. 8, 2020

(65) Prior Publication Data

US 2022/0076945 A1  Mar. 10, 2022

(51) Int. Cl.
| | | |
|---|---|---|
| *H01L 21/02* | (2006.01) | |
| *C23C 16/26* | (2006.01) | |
| *H10B 41/27* | (2023.01) | |

(52) U.S. Cl.
CPC ........ *H01L 21/02115* (2013.01); *C23C 16/26* (2013.01); *H01L 21/02274* (2013.01); *H01L 21/0228* (2013.01); *H10B 41/27* (2023.02)

(58) Field of Classification Search
CPC ......... H01L 21/02115; H01L 21/02274; H01L 21/0228; H01L 27/11556; C23C 16/26
See application file for complete search history.

(56) References Cited

U.S. PATENT DOCUMENTS

| | | | |
|---|---|---|---|
| 6,364,954 B2 | 4/2002 | Umotoy et al. | |
| 7,906,817 B1* | 3/2011 | Wu | .......... H01L 21/02115 257/327 |
| 8,105,465 B2 | 1/2012 | Lee et al. | |
| 2002/0041930 A1 | 4/2002 | Erdemir et al. | |
| 2005/0287771 A1 | 12/2005 | Seamons et al. | |
| 2006/0014397 A1* | 1/2006 | Seamons | .............. C23C 16/4401 257/E21.27 |
| 2008/0153311 A1* | 6/2008 | Padhi | ................ H01L 21/02274 257/E21.27 |
| 2008/0254233 A1* | 10/2008 | Lee | ......................... C23C 16/26 427/595 |
| 2009/0029562 A1 | 1/2009 | Okada et al. | |

(Continued)

FOREIGN PATENT DOCUMENTS

| | | |
|---|---|---|
| EP | 0605814 A1 | 7/1994 |
| TW | I605542 B | 11/2017 |
| WO | 2020167611 A1 | 8/2020 |

OTHER PUBLICATIONS

PCT International Search Report and Written Opinion in PCT/US2021/048137dated Feb. 17, 2022, 11 pages.

*Primary Examiner* — Monica D Harrison
*Assistant Examiner* — Andre C Stevenson
(74) *Attorney, Agent, or Firm* — Servilla Whitney LLC (57) ABSTRACT

Methods for depositing an amorphous carbon layer on a substrate and for filling a substrate feature with an amorphous carbon gap fill are described. The method comprises performing a deposition cycle comprising: introducing a hydrocarbon source into a processing chamber; introducing a plasma initiating gas into the processing chamber; generating a plasma in the processing chamber at a temperature of greater than 600° C.; forming an amorphous carbon layer on a substrate with a deposition rate of greater than 200 nm/hr; and purging the processing chamber.

11 Claims, 6 Drawing Sheets

(56) References Cited

U.S. PATENT DOCUMENTS

| | | | |
|---|---|---|---|
| 2010/0006812 A1* | 1/2010 | Xu | B82Y 30/00 |
| | | | 977/773 |
| 2010/0093187 A1 | 4/2010 | Lee et al. | |
| 2016/0314964 A1* | 10/2016 | Tang | H01L 21/02274 |
| 2019/0185999 A1* | 6/2019 | Shanbhag | C23C 16/45536 |
| 2021/0020432 A1* | 1/2021 | Blanquart | C23C 16/56 |

* cited by examiner

AMORPHOUS CARBON FOR GAP FILL

TECHNICAL FIELD

Embodiments of the present disclosure generally relate to the fabrication of integrated circuits and, more particularly, to the deposition of an amorphous carbon layer on a semiconductor substrate.

BACKGROUND

Integrated circuits have evolved into complex devices that can include millions of transistors, capacitors, and resistors on a single chip. The evolution of chip design continually requires faster circuitry and greater circuit density. The demand for faster circuits with greater circuit densities imposes corresponding demands on the materials used to fabricate such integrated circuits. In particular, as the dimensions of integrated circuit components are reduced to submicron dimensions, it has been necessary to use not only low resistivity conductive materials such as copper to improve the electrical performance of devices, but also low dielectric constant insulating materials, often referred to as low-k dielectric materials.

Producing devices having low-k dielectric materials with little or no surface defects or feature deformation is problematic. Low-k dielectric materials having a dielectric constant less than about 3.0 are often porous and susceptible to being scratched or damaged during subsequent process steps, thus increasing the likelihood of defects being formed on the substrate surface. Such low-k dielectric materials are often brittle and may deform under conventional polishing processes, such as chemical mechanical polishing (CMP). One solution to limiting or reducing surface defects and deformation of such low-k dielectric materials is the deposition of a hard mask over the exposed low-k dielectric materials prior to patterning and etching. The hard mask prevents damage and deformation of the delicate low-k dielectric materials. In addition, a hard mask layer may act as an etch mask in conjunction with conventional lithographic techniques to prevent the removal of the low-k dielectric material during etch.

Amorphous hydrogenated carbon, a-C:H or α-C:H, is a material that may be used as a hard mask for metals, amorphous silicon, and dielectric materials, such as silicon dioxide or silicon nitride materials, among others. Amorphous carbon is considered a carbon material with no long-range crystalline order and which may contain substantial hydrogen content, for example on the order of about 10 to 45 atomic % of hydrogen. Amorphous carbon has been observed to have chemical inertness, optical transparency, and good mechanical properties. While a-C:H films can be deposited via various techniques, plasma enhanced chemical vapor deposition (PECVD) is widely used due to cost efficiency and film property tunability.

Both logic and memory applications require a carbon gap fill process. Carbon material can be removed using plasma etch, without affecting underlayer materials. In multi-tier 3D NAND production, a sacrificial memory hole plug process is desired to protect bottom tier memory holes. Such process need to meet requirements of throughput, dry etch removability and high temperature (~850° C.) stability. Accordingly, there is a need for a gap fill process which provides an amorphous carbon material that is stable at high temperature.

SUMMARY

One or more embodiments are directed to a method of depositing a film. In one or more embodiments, the method comprises: performing a deposition cycle comprising: introducing a hydrocarbon source into a processing chamber; introducing a plasma initiating gas into the processing chamber; generating a plasma in the processing chamber at a temperature of greater than 600° C.; forming an amorphous carbon layer on a substrate; and purging the processing chamber.

In one or more embodiments, a processing method comprises: forming an amorphous carbon film on a substrate surface, the substrate surface having at least one feature thereon, the at least one feature extending a feature depth from the substrate surface to a bottom surface, the at least one feature having a width defined by a first sidewall and a second sidewall, wherein the amorphous carbon film is deposited on the substrate surface, the first sidewall, the second sidewall, and the bottom surface of the at least one feature.

One or more embodiments are directed to non-transitory computer readable medium including instructions, that, when executed by a controller of a processing chamber, cause the processing chamber to perform the operations of: perform a deposition cycle comprising: introduce a hydrocarbon source into a processing chamber; introduce a plasma initiating gas into the processing chamber; generate a plasma in the processing chamber at a temperature of greater than 600° C.; form an amorphous carbon layer on a substrate; and purge the processing chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, 10%, 5%, 2%, or 1%, would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

In one or more embodiments, plasma enhanced chemical vapor deposition (PECVD) is widely used to deposit amorphous carbon films due to cost efficiency and film property versatility. In a PECVD process, a hydrocarbon source, such as a gas-phase hydrocarbon or vapors of a liquid-phase hydrocarbon that have been entrained in a carrier gas, is introduced into a PECVD chamber. In one or more embodiments, the plasma is generated by a remote plasma source (RPS) or a capacitively coupled plasma (CCP) or an inductively coupled plasma (ICP) with ambient gas like argon (Ar), helium (He), ammonia ($NH_3$), nitrogen ($N_2$), hydrogen ($H_2$), or their mixtures. Plasma is then initiated in the chamber to create excited CH-radicals. The excited CH-radicals are chemically bound to the surface of a substrate positioned in the chamber, forming the desired amorphous carbon films thereon.

PECVD techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

Embodiments described herein in reference to a PECVD process can be carried out using any suitable thin film deposition system. Examples of suitable systems include the CENTURA® systems which may use a DXZ® processing chamber, PRECISION 5000® systems, PRODUCER® systems, PRODUCER® GT™ systems, PRODUCER® XP Precision™ systems, PRODUCER® SE™ systems, ENDURA® systems, Sym3® processing chamber, and Mesa™ processing chamber, all of which are commercially available from Applied Materials, Inc., of Santa Clara, Calif. Other tools capable of performing PECVD processes may also be adapted to benefit from the embodiments described herein. In addition, any system enabling the PECVD processes described herein can be used to advantage. Any apparatus description described herein is illustrative and should not be construed or interpreted as limiting the scope of the implementations described herein.

Device manufacturers using an amorphous carbon layer demand two critical requirements be met: (1) high selectivity of the hard mask during the dry etching of underlying materials and (2) high optical transparency in the visible spectrum for lithographic registration accuracy. As used herein, the term "dry etching" generally refers to etching processes where a material is not dissolved by immersion in a chemical solution and includes methods such as reactive ion etching, sputter etching, and vapor phase etching.

Hard mask layers are often used in narrow and/or deep contact etch applications and in high aspect ratio (HAR) etch applications, where photoresist may not be thick enough to mask the underlying layer. This is especially applicable as the critical dimension shrinks.

V-NAND, or 3D-NAND, structures are used in flash memory applications. V-NAND devices are vertically stacked NAND structures with a large number of cells arranged in blocks. As used herein, the term "3D NAND" refers to a type of electronic (solid-state) non-volatile computer storage memory in which the memory cells are stacked in multiple layers. 3D NAND memory generally includes a plurality of memory cells that include floating-gate transistors. Traditionally, 3D NAND memory cells include a plurality of NAND memory structures arranged in three dimensions around a bit line.

A critical step in 3D NAND technology is slit etch. As the number of tiers increases in each technology node, to control the slit etch profile, the thickness of the hard mask film has to proportionally increase to withstand high aspect etch profiles. Amorphous carbon (aC:H) films can be used due to high hardness and easy to strip after slit etch. In multi-tier 3D NAND production, a sacrificial memory hole plug process is needed to protect bottom tier memory holes. Such process needs to meet requirements of throughput, dry etch removability and high temperature (e.g. 850° C.) stability.

Other approaches include amorphous silicon-based processes or other amorphous carbon-based processes. Amorphous silicon material requires a wet removal process, which deleteriously affects oxide/nitride stacks. Other amorphous carbon materials suffer from low deposition rates, slow throughput, and instability at high temperature.

In one or more embodiments, provided are method for depositing amorphous carbon (a-C:H) materials with improved conformality in a chemical vapor deposition system, particularly in a plasma enhanced chemical vapor deposition (PECVD) system. Conformality of a layer is typically quantified by a ratio (which may be represented as a percentage) of the average thickness of a layer deposited on the sidewalls of a feature to the average thickness of the same deposited layer on the field, or upper surface, of the substrate. Layers deposited by the methods described herein are observed to have a conformality of greater than about 30%, such as 70% or greater, about 7:10 or greater, such as about 80% or greater, about 4:5 or greater, to about 100%, about 1:1, or to about 200% or greater, about 2:1.

The amorphous carbon material of one or more embodiments can be easily removed via oxygen ($O_2$) plasma, eliminating impacts on the oxide/nitride stack. The process of one or more embodiments advantageously provides a deposition rate that is more than ten times greater than other methods. Additionally, the process of one or more embodiments advantageously provides tunability with deposition profile compared to other amorphous carbon materials, while also having high temperature stability.

In particular, methods are provided for improved conformal deposition of an a-C:H layer. Conformal deposition maybe improved by utilizing precursors having carbon to hydrogen ratios of 1:2 or greater, such as a carbon to hydrogen ratio of 2:3 or greater, with plasma-initiating gas selected from the group of helium, hydrogen, nitrogen, argon, or combinations thereof, at increasing precursor to plasma-initiating gas flow rates, at increasing deposition pressures, at increasing deposition temperatures, at lower RF power application, with plasma environments having reduced deposition rates, by depositing amorphous carbon in multiple layers, and combinations thereof. The deposition processes herein may be per formed in a suitable processing system.

Figure 1A:
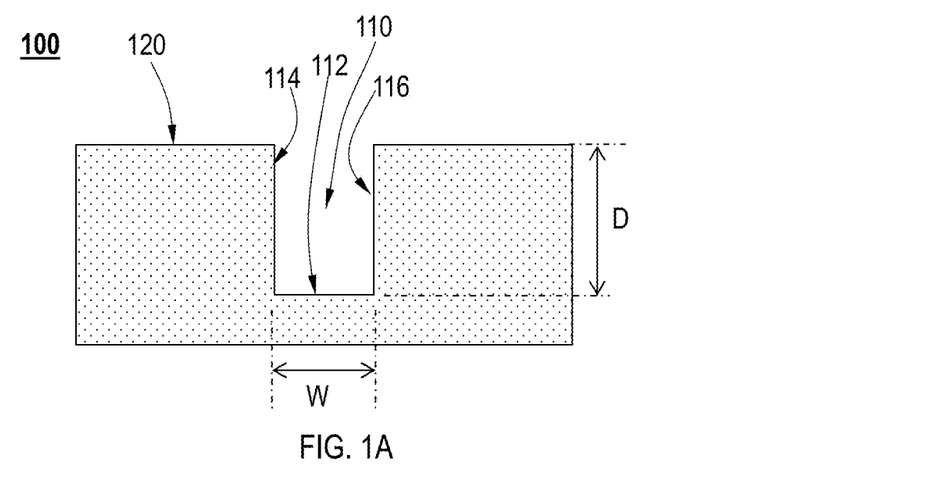
FIG. 1A illustrates a cross-sectional view of a substrate according to one or more embodiments.

For descriptive purposes, the deposition of amorphous carbon films for gap fill applications is described. However, those skilled in the art will understand that the precursors and methods described are not limited to gap fill applications and can be used for any PECVD film formation. FIG. 1A shows a partial cross-sectional view of a substrate 100 with a feature 110. The Figures show substrates having a single feature for illustrative purposes; however, those skilled in the art will understand that there can be more than one feature. The shape of the feature 110 can be any suitable shape including, but not limited to, trenches and cylindrical vias. As used in this regard, the term "feature" means any intentional surface irregularity. Suitable examples of features include, but are not limited to trenches which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1, 40:1, 45:1, or 50:1.

In one or more embodiments, the substrate 100 has a substrate surface 120. The at least one feature 110 forms an opening in the substrate surface 120. The feature 110 extends from the substrate surface 120 to a depth D to a bottom surface 112. The feature 110 has a first sidewall 114 and a second sidewall 116 that define a width W of the feature 110. The open area formed by the sidewalls and bottom are also referred to as a gap.

One or more embodiments of the disclosure are directed to processing methods in which a substrate surface with at least one feature thereon is provided. As used in this regard, the term "provided" means that the substrate is placed into a position or environment for further processing.

Figure 1B:
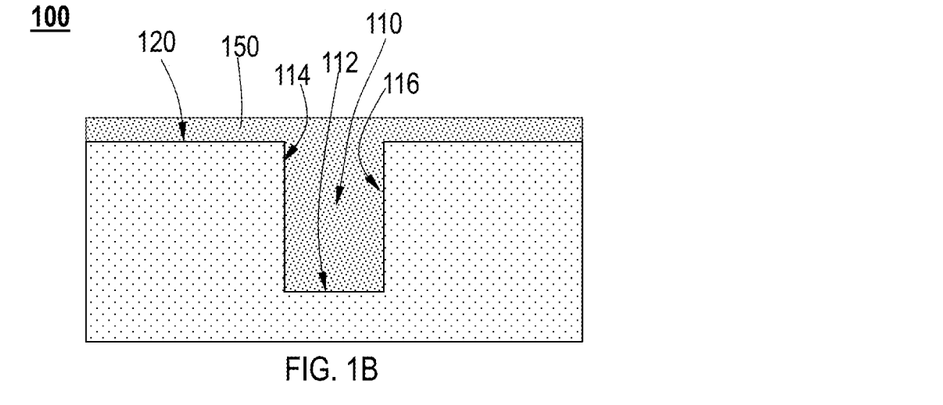
FIG. 1B illustrates a cross-sectional view of a substrate according to one or more embodiments.

FIG. 1B shows a partial cross-sectional view of a substrate 100 with a feature 110. As shown in FIG. 1B, an amorphous carbon film 150 is formed on the substrate surface 120 and the first sidewall 114, second sidewall 116 and bottom surface 112 of the at least one feature 110. The amorphous carbon film 150 fills the at least one feature 110 so that substantially no seam is formed. A seam is a gap that forms in the feature between, but not necessarily in the middle of, the sidewalls of the feature 110. As used in this regard, the term "substantially no seam" means that any gap formed in the film between the sidewalls is less than about 1% of the cross-sectional area of the sidewall.

The amorphous carbon film 150 can be formed by any suitable process. In some embodiments, the forming the amorphous carbon film 150 is done by plasma-enhanced chemical vapor deposition (PECVD). Stated differently, the amorphous carbon film 150 film can be deposited by a plasma-enhanced chemical vapor deposition process.

Figure 1C:
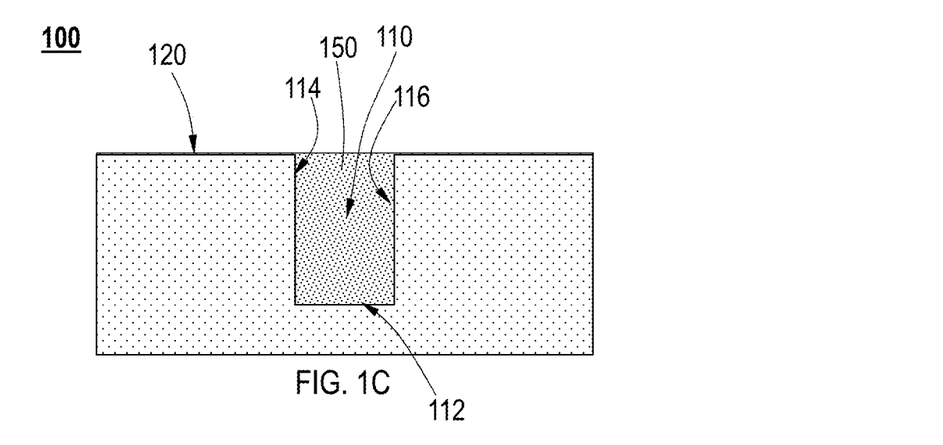
FIG. 1C illustrates a cross-sectional view of a substrate according to one or more embodiments.

FIG. 1C shows a partial cross-sectional view of the substrate 100 with a feature 110, where the amorphous carbon film 150 has been planarized such that it is substantially coplanar with the substrate surface 120. Planarization may be conducted by any means known to the skilled artisan including, but not limited to, chemical mechanical polishing (CMP), etching, and the like.

Aspects of the invention provide for improved conformal deposition of an amorphous carbon layer. Improved conformal deposition may be achieved by a process utilizing precursors having carbon to hydrogen ratios of 1:2 or greater, such as a carbon to hydrogen ratio of 2:3 or greater, may be achieved with a plasma-initiating gas selected from the group of helium, hydrogen, nitrogen, argon, or combinations thereof, may be achieved at increasing precursor to plasma-initiating gas flow rates, may be achieved at increasing deposition pressures, may be achieved at increasing deposition temperatures, may be achieved at lower RF power application, may be achieved with plasma environments having reduced deposition rates, may be achieved with increasing spacing between gas distributer and substrate surface, may be achieved by depositing amorphous carbon in multiple layers, and combinations thereof. It is believed that the processes described herein provide for an increased deposition rate and better thermal stability, thereby, providing a more conformal deposition process.

Figure 4:
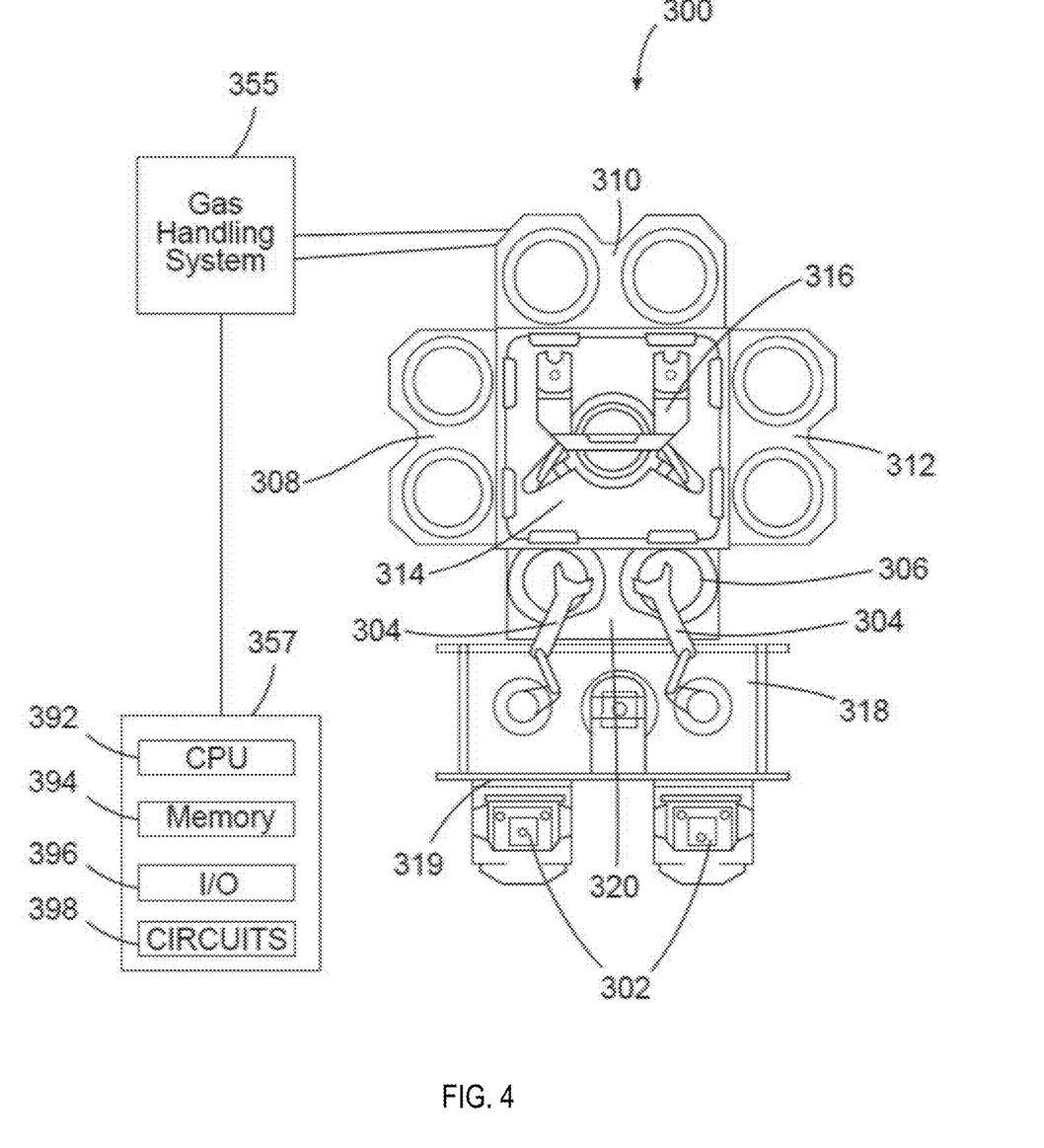
FIG. 4 illustrates a cluster tool according to one or more embodiments of the disclosure.

In one or more embodiments of the deposition process, an amorphous carbon layer is formed by a process that includes introducing a hydrocarbon source and a plasma-initiating gas into a processing chamber, such as process chamber 300 described in conjunction with FIG. 4. The hydrocarbon source is a mixture of one or more hydrocarbon compounds, and, optionally, a carrier gas, such as argon.

The one or more hydrocarbon compounds may comprise compounds having a carbon atom to hydrogen atom ratio of 1:2 or greater, for example greater than 1:2. For example, a carbon to hydrogen (or substituent group, such as fluorine, for hydrogen) ratio of 2:3 or greater, such as from 2:3 to 2:1, for example, from about 2:3 to about 3:2, is observed to produce amorphous carbon films with improved conformality. It is believed such hydrocarbon compounds with the described carbon to hydrogen atom ratio lead to a more isotropic deposition process.

The hydrocarbon compounds may be partially or completely doped derivatives of hydrocarbon compounds may also benefit from the inventive method. Derivatives include nitrogen-, fluorine-, oxygen-, hydroxyl group-, and boron-containing derivatives of hydrocarbon compounds.

Generally, hydrocarbon compounds or derivatives thereof that may be included in the hydrocarbon source may be described by the formula $C_A H_B F_C$, where A has a range of between 1 and 24, B has a range of between 0 and 50, C has a range of 0 to 50 and the ratio of A to B+C is 1:2 or greater, for example greater than 1:2. For example, the ratio of A to B+C may be 2:3 or greater, such as from 2:3 to 2:1, and in a further example, from 2:3 to 3:2. In one or more embodiments, where C=0, the hydrocarbon source may have the formula $C_xH_y$, with $2/3 \leq x/y \leq 3/2$, with x/y being the respective number of atoms. Alternatively, for oxygen and/or nitrogen substituted compounds, the hydrocarbon source may be described by the formula $C_AN_BO_CF_DN_E$, where A has a range of between 1 and 24, B has a range of between 0 and 50, C has a range of 0 to 10, D has a range of 0 to 50, E has a range of 0 to 10, and the ratio of A to B+C+D+E is 1:2 or greater, for example greater than 1:2. For example, A to B+C+D+E may be 2:3 or greater, such as from 2:3 to 2:1, and in a further example, from 2:3 to 3:2.

Suitable hydrocarbon compounds include one or more of the following compounds, for example, alkynes such as acetylene (CH), vinylacetylene and derivatives thereof, aromatic hydrocarbons, such as benzene, styrene, toluene, Xylene, pyridine, ethylbenzene, acetophenone, methylbenzoate, phenyl acetate, phenol, cresol, furan, and the like, alpha-terpinene, cymene, 1.1.3.3.-tetramethylbutylbenzene, t-butylether, t-butylethylene, methyl-methacrylate, and t-butylfurfurylether, compounds having the formula $C_3H_2$ and $C_5H_4$, halogenated aromatic compounds including monofluorobenzene, difluorobenzenes, tetrafluorobenzenes, hexafluorobenzene and the like. Additional suitable hydrocarbons include alkenes such as ethylene, propylene, butylene, pentene, and the like, dienes such as butadiene, isoprene, pentadiene, hexadiene and the like, and halogenated alkenes include monofluoroethylene, difluoroethylenes, trifluoroethylene, tetrafluoroethylene, monochloroethylene, dichloroethylenes, trichloroethylene, tetrachloroethylene, and the like. One example of a precursor having a carbon atom to hydrogen atom ratio of greater than 1:2 is $C_4H_2$, which may be diacetylene.

Additionally, in one or more embodiments, precursors having a carbon atom to hydrogen atom ratio of 3:1 or greater, such as 5:1, for example, of 10:1 or greater. It is believed that as the carbon to hydrogen ratio increases, carbon atoms will bond with neighboring carbon atoms during deposition, resulting in better conformality of deposited film by forming a web of complex three-dimensional short order structures.

The amorphous carbon deposition process includes the use of a plasma initiating gas that is introduced into the chamber at before and/or same time as the hydrocarbon compound and a plasma is initiated to begin deposition. The plasma-initiating gas may be a high ionization potential gas including to, and not limited to, helium gas, hydrogen gas, nitrogen gas, argon gas and combinations thereof. The plasma-initiating gas may also be a chemically inert gas. Such as helium gas, nitrogen gas, or argon gas. Suitable ionization potentials for gases are from about 5 eV (electron potential) to 25 eV. The plasma-initiating gas may be introduced into the chamber before the hydrocarbon source, which allows a stable plasma to be formed and reduces the chances of arcing. The use of the plasma-initiating gas with high ionization potential has been observed to provide for less anisotropic etching of film during deposition thereby improving conformality in amorphous carbon film deposition. An inert gas as a dilutant gas or a carrier gas, such as argon, may be introduced with the plasma-initiating gas, the hydrocarbon source, or combinations thereof.

The hydrocarbon compound and plasma-initiating gas may be introduced at a hydrocarbon compound to plasma-initiating gas flow ratio from about 1:100 or greater, for example, from about 1:100 to 100:1, such as from about 1:10 to about 10:1 for the amorphous carbon deposition. In one embodiment, the hydrocarbon compound to plasma-initiating gas flow ratio may be from about 1:5 or greater, such as from about 1:5 to about 2:1, for example, from about 1:2 to about 1:1, may be used for the amorphous carbon deposition. Increasing hydrocarbon compound to plasma-initiating gas flow ratio has been observed to provide improved conformality over lower ratios.

The amorphous carbon layer may be deposited from the processing gas by maintaining a chamber pressure of about 2 Torr or greater, such as from about 2 Torr to about 20 Torr, and in one embodiment, about 7 Torr or greater, for example, from about 7 Torr to about 9 Torr. It has been observed that conformality increases with increasing pressures and it is believed that ions experience more scattering before reaching the substrate, thereby losing some ability to etch and radicals which experience more scattering and arrive at the substrate surface an angle that is more random and isotropic for a more isotropic and conformal film growth.

The amorphous carbon layer of one or more embodiments is advantageously deposited from the hydrocarbon source in a chamber maintaining a substrate temperature above 600° C., including a temperature range of from about 600° C. to about 800° C., such as at a temperature of about 600° C., about 650° C., about 700° C., about 750° C., and about 800° C. Without intending to be bound by theory, it is thought that the deposition at high temperatures produces amorphous carbon gap fill films with improved thermal stability. It has surprisingly been observed that depositing amorphous carbon films at increasing temperatures increases the deposition rate and improves conformality. Also, at increasing temperature, the diffusivity or mobility of adsorbed carbon precursor is increasing, leading to more isotropic deposition and improved conformality.

In one or more embodiments, the amorphous carbon layer has a deposition rate of greater than 200 nm/hr, including greater than 300 nm/hr, and greater than 350 nm/hr.

In one or more embodiments, the hydrocarbon source and a plasma-initiating gas are introduced into the chamber and a plasma is initiated to begin deposition. A dual-frequency RF system may be used to generate the plasma. A dual frequency RF power application is believed to provide independent control of flux and ion energy, since it is believed that the energy of the ions hitting the film surface influences the film density. It is believed that the high frequency plasma controls plasma density and a low frequency plasma controls kinetic energy of the ions hitting the substrate surface. A dual-frequency source of mixed RF power provides a high frequency power in a range from about 10 MHz to about 30 MHz, for example, about 13.56 MHz, as well as a low frequency power in a range of from about 10 KHZ to about 1 MHz, for example, about 350 KHZ. When a dual frequency RF system is used to deposit an amorphous carbon film, the ratio of the second RF power to the total mixed frequency power is preferably less than about 0.6 to 1.0 (0.6:1). The applied RF power and use of one or more frequencies may be varied based upon the substrate size and the equipment used. A single frequency RF power application may be used, and is typically, an application of the high frequency power as described herein.

Plasma may be generated by applying RF power at a power density to substrate surface area of from about 0.01 W/cm to about 5 W/cm, such as from about 0.01 to about 1 W/cm, for example, about 0.1 W/cm. The power application may be from about 1 Watt to about 2000 watts, such as from about 10 W to about 200 W, for example about 20 W for a 300 mm substrate.

Without intending to be bound by theory, it is thought that plasma process reduces amorphous carbon increase rates to improve the conformality by reducing the number of energetic ions, making hydrocarbon compounds, i.e., radicals, arriving at the substrate surface with a more random deposition pattern, thereby providing the resulting film growth with a more isotropic deposition pattern. The increase plasma deposition is also observed to provide a higher deposition rate that allows for adsorbed carbon precursors to diffuse on the surface of the substrate and provide a more conformal layer.

An exemplary deposition process for processing 300 mm circular substrates employs a plasma-initiating gas, such as helium, and a hydrocarbon source, such as acetylene ($C_2H_2$). The process may include supplying a plasma-initiating gas, such as helium, at a flow rate from about 400 sccm to about 8000 sccm, Supplying a hydrocarbon source, such as acetylene ($C_2H_2$), at a flow rate from about 400 sccm and 8000 sccm, applying a dual frequency RF power from about 10 W to about 2000 W, maintaining a chamber pressure from about 2 Torr about 20 Torr, and maintaining a chamber temperature above 600° C. This process range provides a deposition rate for an amorphous layer in the range of about 200 nm/hr to about 1000 nm/hr with a conformality (a ratio of the average thickness of a layer deposited on the sidewalls of a feature to the average thickness of the same deposited layer on the field, or upper surface, of the substrate) from about 30% to about 100%.

In one or more embodiments of the deposition process, a plurality of individual amorphous carbon depositions are performed to form an amorphous carbon layer. In one aspect of the multiple deposition process, a deposition step, such as described herein, is followed by an etching step, in which plasma-initiating gas, a dilution gas, and/or precursor can be flown with a reduced or no deposition rate. A suitable plasma-initiating gas, a dilution gas, and/or precursor can be flown into the chamber at a flow rate from about 100 sccm to about 40000 sccm. A plasma may be initiated for the etch step if the plasma-initiating gas and/or a dilution gas is used. In one or more embodiments, an etch plasma is used to trim the carbon layer morphology. After trimming, conformality is improved. In one or more embodiments, the etch gas or etchant includes one or more of hydrogen ($H_2$), ammonia ($NH_3$), nitrous oxide ($N_2O$), oxygen ($O_2$), and the like. The deposition and etch steps may then be repeated until a desired thickness is obtained and may be from 1 to 100 cycles, such as from 10 to 50 cycles, for example 30 cycles, or alternatively deposited between about 1% to about 100% of the thickness of the amorphous carbon material, such as from about 2% to about 10% cycles, for example about 3.3%. An individual cycle may deposit amorphous carbon material from about 1 Å to about 1000 Å thickness for each cycle to form an amorphous carbon layer having a thickness from about 10 Å to about 15000 Å. The cyclical deposition process may use one or more of the above described process parameter adjustments.

In one or more embodiments, a multi-layer deposition scheme improves conformality. In general, conformality is improved when the number of layers increases for a given amorphous carbon film thickness (smaller individual layer thickness and more repetition).

Figure 2A:
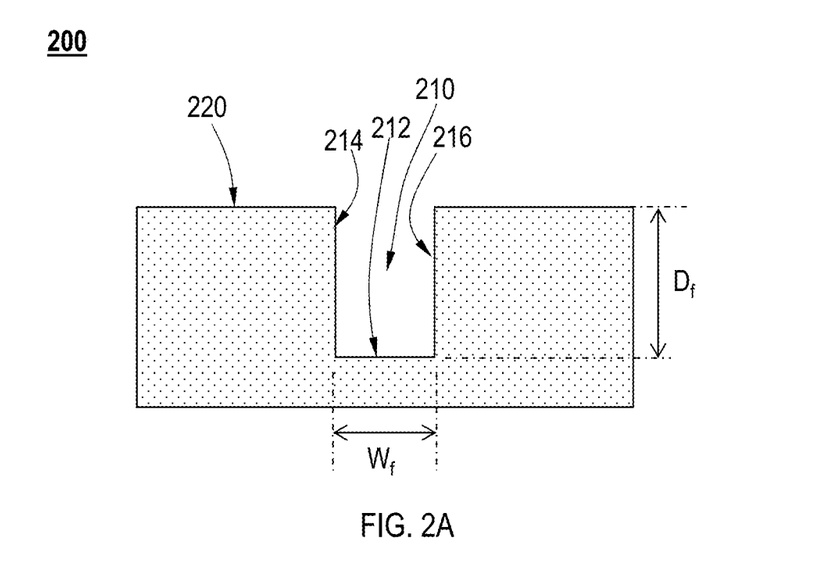
FIG. 2A illustrates a cross-sectional view of a substrate according to one or more embodiments.
Figure 2B:
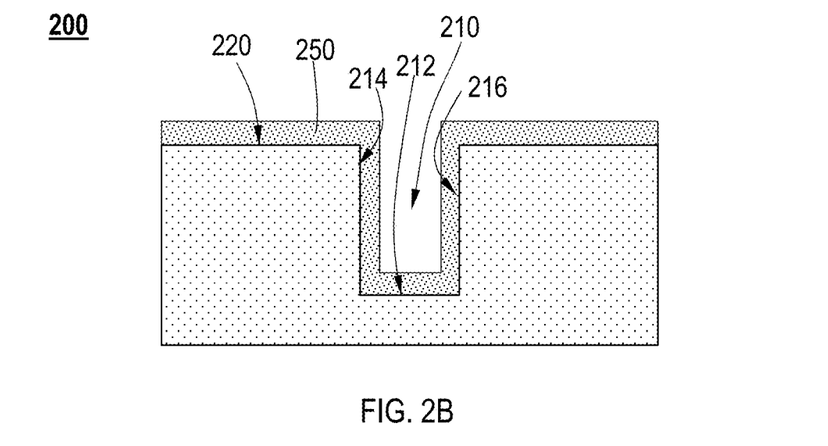
FIG. 2B illustrates a cross-sectional view of a substrate according to one or more embodiments.

One major advantage of the inventive method is the enhancement of conformality over other amorphous carbon deposition processes, as illustrated in FIGS. 2A-2B. FIG. 2A shows a partial cross-sectional view of a substrate 200 with a feature 210. In one or more embodiments, the substrate 200 has a substrate surface 220. The at least one feature 210 forms an opening in the substrate surface 220. The feature 210 extends from the substrate surface 220 to a depth $D_f$ to a bottom surface 212. The feature 210 has a first sidewall 214 and a second sidewall 216 that define a width $W_f$ of the feature 210. The open area formed by the sidewalls and bottom are also referred to as a gap.

FIG. 2B illustrates a schematic cross-sectional view of a substrate 200 with a feature 210 and an amorphous carbon layer 250 formed thereon. Amorphous carbon layer 250 illustrates the typical appearance of a film deposited using the inventive method. Qualitatively, amorphous carbon layer 250 is highly conformal and completely covers sidewalls 214, 216 and bottom surface 212 of feature 210. Quantitatively, amorphous carbon layer 250 may have a conformality on the order from about 30% to about 100%. For example, from about 70% to about 90%, wherein conformality is defined as the ratio of the average thickness S of amorphous carbon layer 250 deposited on the sidewalls 214, 216 to the average thickness T of amorphous carbon layer 250 on upper surface 220 of substrate 200.

Figure 3A:
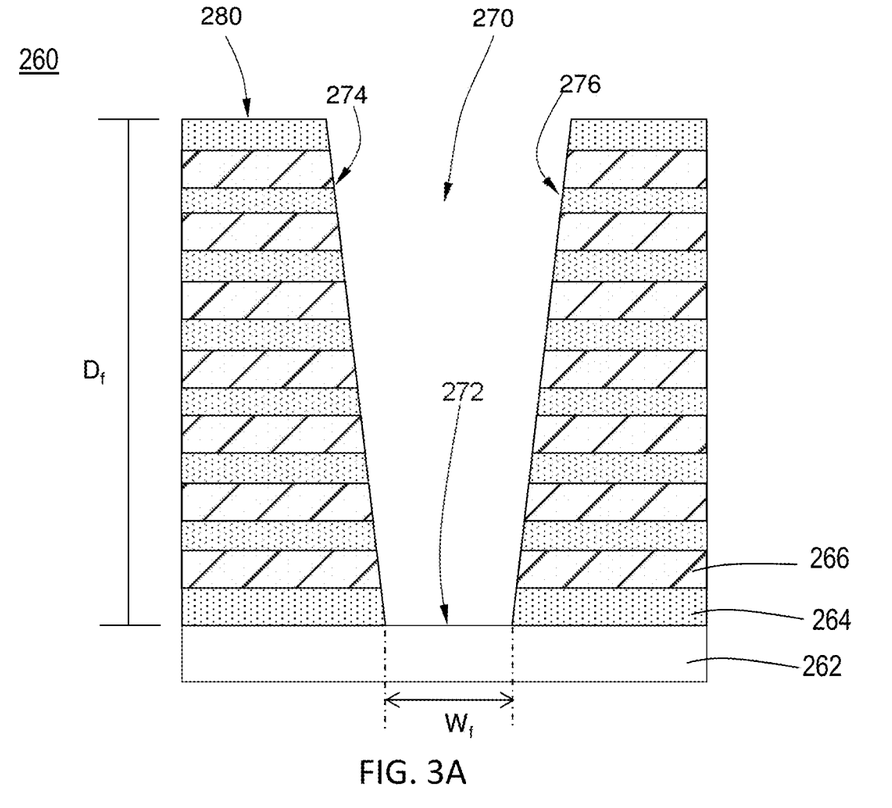
FIG. 3A illustrates a cross-sectional view of a substrate according to one or more embodiments.

FIG. 3A shows a partial cross-sectional view of a substrate 260 with a feature 270. The substrate 260 has a substrate surface 280. The at least one feature 270 forms an opening in the substrate surface 280. The at least one feature 270 extends from the substrate surface 280 to a feature depth $D_f$ to a bottom surface 272. The at least one feature 270 has a first sidewall 274 and a second sidewall 276 that define a width $W_f$ of the at least one feature 270. The open area formed by the sidewalls 274, 276 and bottom 272 are also referred to as a gap. In one or more embodiments, the width $W_f$ is homogenous along the depth $D_1$ of the at least one feature 270. In other embodiments, the width, $W_{f}$, is greater at the top of the at least one feature 270 than the width, $W_{f}$, at the bottom surface 272 of the at least one feature 270. In still further embodiments, the width, $W_{f}$, is greater in the middle of the at least one feature 270 than the width, $W_{f}$, at the top of the at least one feature 270 and greater than the width, $W_{f}$, at the bottom surface 272 of the at least one feature 270.

In one or more embodiments, the substrate 260 is a film stack comprising a plurality of alternating layers of a nitride material 264 and an oxide material 266 deposited on a semiconductor substrate 260.

The semiconductor substrate 262 can be any suitable substrate material. In one or more embodiments, the semiconductor substrate 2622 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), copper indium gallium selenide (CIGS), other semiconductor materials, or any combination thereof. In one or more embodiments, the semiconductor substrate 262 comprises one or more of silicon (Si), germanium (Ge), gallium (Ga), arsenic (As), indium (In), phosphorus (P), copper (Cu), or selenium (Se). Although a few examples of materials from which the substrate 262 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, the at least one feature 270 comprises a memory hole or a word line slit. Accordingly, in one or more embodiments, the substrate 260 comprises a memory device or a logic device, e.g. NAND, VNAND, DRAM, or the like.

Figure 3B:
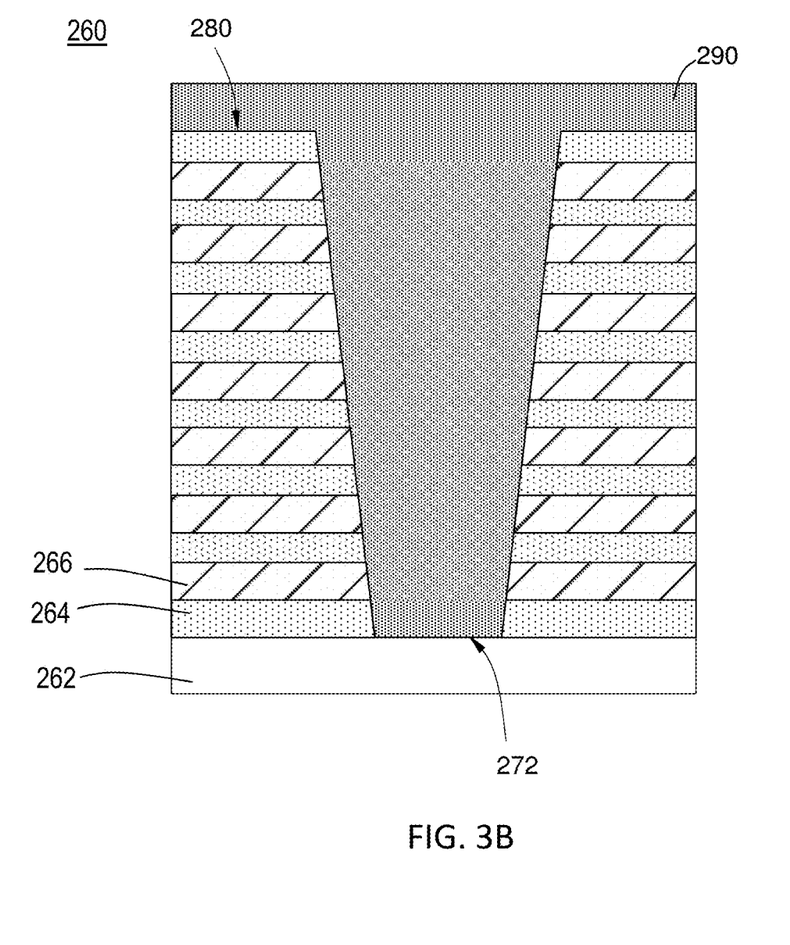
FIG. 3B illustrates a cross-sectional view of a substrate according to one or more embodiments.

FIG. 3B shows a cross-sectional schematic of a gap fill process in accordance with one or more embodiment of the disclosure. In one or more embodiments, an amorphous carbon film 290 is formed on the substrate surface 280 and the walls 274, 27 and the bottom 272 of the at least one feature 270. As illustrated in FIG. 3B, in one or more embodiments, the amorphous carbon film 290 is seam free within the width, $W_f$, of the at least one feature 270.

In some embodiments, the amorphous carbon film 290 forms conformally on the at least one feature 270. As used herein, the term "conformal", or "conformally", refers to a layer that adheres to and uniformly covers exposed surfaces with a thickness having a variation of less than 1% relative to the average thickness of the film. For example, a 1,000 Å thick film would have less than 10 Å variations in thickness. This thickness and variation includes edges, corners, sides, and the bottom of recesses. For example, a conformal layer deposited by PECVD in various embodiments of the disclosure would provide coverage over the deposited region of essentially uniform thickness on complex surfaces.

In some embodiments, the amorphous carbon film 290 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film. In some embodiments, the amorphous carbon film 290 is a pinhole-free film. As used herein, the term "pinhole-free" refers to a layer that covers an entire exposed surface without gaps, bare spots, holes, pinholes, and the like that reveal material underlying the deposited layer. A pinhole-free layer may have holes or pinholes with a surface area less than about 1% of the total surface area of the film.

Figure 5:
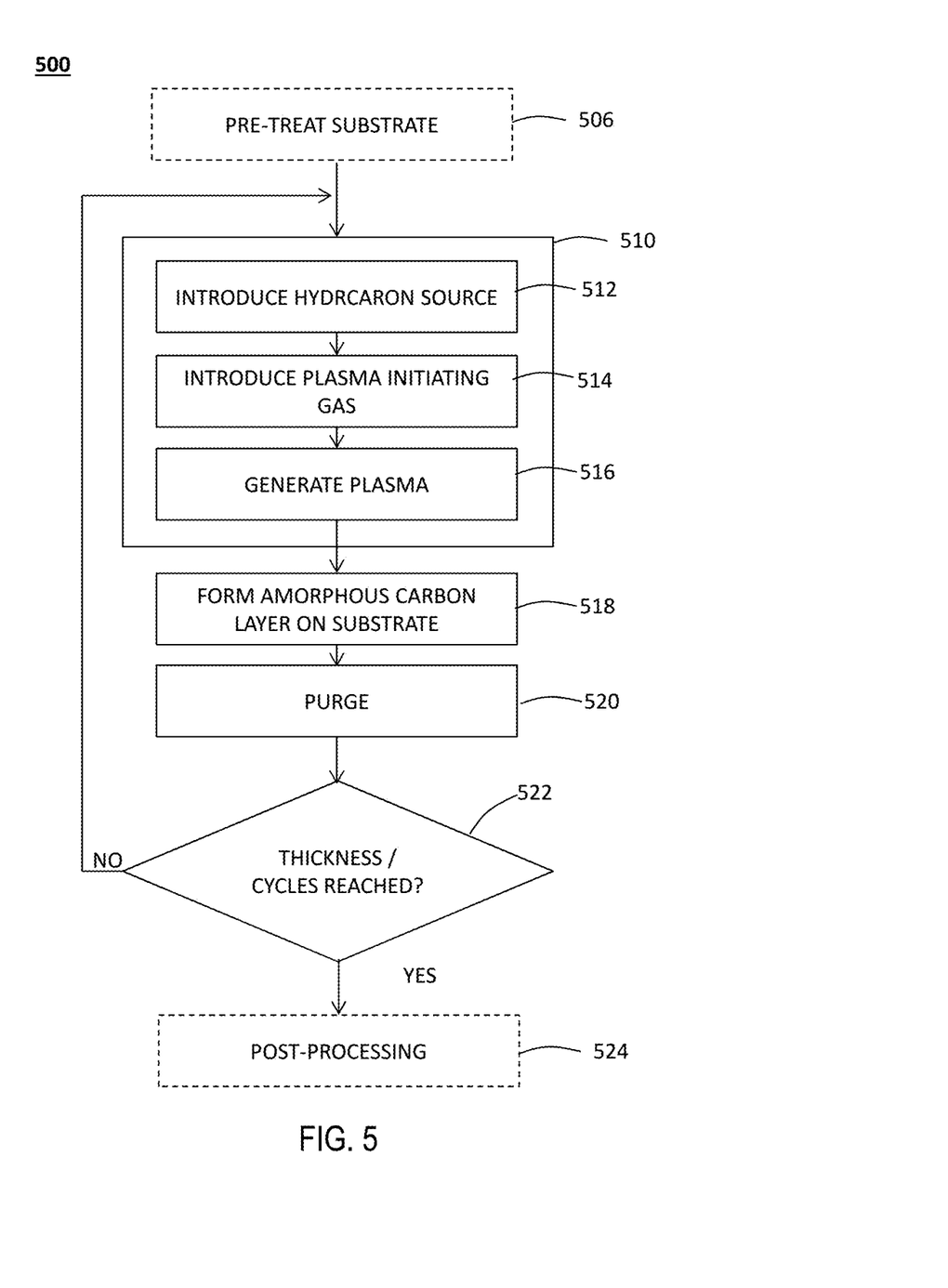
FIG. 5 illustrates a flowchart of a processing method in accordance with one or more embodiments of the disclosure.

With reference to FIG. 5, one or more embodiments of the disclosure are directed to method 500 of depositing a film. In some embodiments, the method 500 includes a pre-treatment operation 506. The pre-treatment can be any suitable pre-treatment known to the skilled artisan. Suitable pre-treatments include, but are not limited to, pre-heating, cleaning, soaking, native oxide removal, or deposition of an adhesion layer (e.g. titanium nitride (TiN)).

At deposition 510, a process cycle is performed to deposit a film on the substrate (or substrate surface). The deposition process can include one or more operations to form a film on the substrate. In operation 512 a hydrocarbon source is introduced into the processing chamber. At operation 514, a plasma initiating gas is introduced into the processing chamber. At operation 516, a plasma is generated in the processing chamber at a temperature of greater than 600° C.

At operation 518, an amorphous carbon layer is formed on the substrate. At operation 520, the processing chamber is purged.

At decision point 522, the thickness of the deposited film, or number of cycles is considered. If the deposited film has reached a predetermined thickness or a predetermined number of process cycles have been performed, the method 500 moves to an optional post-processing operation 524. If the thickness of the deposited film or the number of process cycles has not reached the predetermined threshold, the method 500 returns to operation 510 to introduce a hydrocarbon source again in operation 512, and continuing.

The optional post-processing operation 524 can be, for example, a process to modify film properties (e.g., annealing) or a further film deposition process (e.g., additional ALD or CVD processes) to grow additional films. In some embodiments, the post-processing operation 524 can be a process that modifies a property of the deposited film. In some embodiments, the post-processing operation 524 comprises annealing the film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the film is annealed for a predetermined time in the range of about 15 seconds to about 90 minutes, or in the range of about 1 minute to about 60 minutes.

In some embodiments, annealing the as-deposited film increases the density, decreases the resistivity and/or increases the purity of the film.

A variety of multi-processing platforms, including the Centura®, Dual ACP, Producer® GT, Precision®, and Endura® platform, available from Applied Materials® as well as other processing systems may be utilized. With reference to FIG. 4, a cluster tool 300 includes at least one central transfer station 314 with a plurality of sides. A robot 316 is positioned within the central transfer station 314 and is configured to move a robot blade and a wafer to each of the plurality of sides.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

Referring to FIG. 4, the cluster tool 300 comprises a plurality of processing chambers 308, 310, and 312, also referred to as process stations, connected to the central transfer station. The various processing chambers provide separate processing regions isolated from adjacent process stations. The processing chamber can be any suitable chamber including, but not limited to, a preclean chamber, a deposition chamber, an annealing chamber, an etching chamber, a selective etching chamber, and the like. The particular arrangement of process chambers and components can be varied depending on the cluster tool and should not be taken as limiting the scope of the disclosure.

In some embodiments, the cluster tool 300 includes an isotropic etching chamber for selectively etching/trimming the semiconductor material layers 224. The isotropic etching chamber of some embodiments comprises one or more a fluorine-based dry etching chamber. In some embodiments, the cluster tool 300 includes a pre-cleaning chamber connected to the central transfer station.

In the embodiment shown in FIG. 4, a factory interface 318 is connected to a front of the cluster tool 300. The factory interface 318 includes chambers 302 for loading and unloading on a front 319 of the factory interface 318.

The size and shape of the loading chamber and unloading chamber 302 can vary depending on, for example, the substrates being processed in the cluster tool 300.

In the embodiment shown, the loading chamber and unloading chamber 302 are sized to hold a wafer cassette with a plurality of wafers positioned within the cassette.

Robots 304 are within the factory interface 318 and can move between the loading and unloading chambers 302. The robots 304 are capable of transferring a wafer from a cassette in the loading chamber 302 through the factory interface 318 to load lock chamber 320. The robots 304 are also capable of transferring a wafer from the load lock chamber 320 through the factory interface 318 to a cassette in the unloading chamber 302.

The robot 316 of some embodiments is a multi-arm robot capable of independently moving more than one wafer at a time. The robot 316 is configured to move wafers between the chambers around the transfer chamber 314. Individual wafers are carried upon a wafer transport blade that is located at a distal end of the first robotic mechanism.

A system controller 357 is in communication with the robot 316, and a plurality of processing chambers 308, 310 and 312. The system controller 357 can be any suitable component that can control the processing chambers and robots. For example, the system controller 357 can be a computer including a central processing unit (CPU) 392, memory 394, inputs/outputs 396, suitable circuits 398, and storage.

Processes may generally be stored in the memory of the system controller 357 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the system controller 357 has a configuration to control the deposition of amorphous carbon on the substrate.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising a deposition chamber, a plasma chamber, a curing chamber, an etching chamber; and a controller connected to the central transfer station and the plurality of process stations, the controller configured to activate the robot to move the wafer between process stations, and to control a process occurring in each of the process stations.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Example 1

An amorphous carbon layer was deposited by providing a flow rate of Argon to the processing chamber at about 2000 sccm, providing a flow rate of $C_2H_2$ to the processing chamber at about 300 sccm, applying a high frequency RF power (13.56 MHz) at about 200 W, maintaining a deposition temperature of about 650° C., maintaining a chamber pressure of about 10 Torr, with a spacing of about 300 mils to produce a deposition rate of 1800 nm/hr and it was observed to achieve conformalities of about 83% dense area to about 96% open area step coverage (measure of conformality).

Example 2: Comparative

An amorphous carbon layer was deposited by providing a flow rate of helium to the processing chamber at about 100 sccm, providing a flow rate of $C_3H_6$ to the processing chamber at about 100 sccm, providing a flow rate of $NH_3$ to the processing chamber at about 100 sccm, applying a high frequency RF power (13.56 MHz) at about 600 W, maintaining a deposition temperature of about 400° C., maintaining a chamber pressure of about 9 Torr, with a spacing of about 400 mils to produce a deposition rate of 30 nm/hr and it was observed to achieve conformalities of about 83% dense area to about 96% open area step coverage (measure of conformality).

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a film on a semiconductor device, the method comprising:
    performing a deposition cycle with a deposition rate of greater than 200 nm/hr, the deposition cycle comprising:
        introducing a hydrocarbon source into a processing chamber, wherein the hydrocarbon source has a carbon to hydrogen atom ratio of greater than 1:2;
        introducing a plasma initiating gas into the processing chamber, the hydrocarbon source and the plasma initiating gas introduced at a hydrocarbon compound to plasma-initiating gas flow ratio from 1:100 to 100:1;
        generating a plasma in the processing chamber at a temperature of greater than 600° C. to form an amorphous carbon layer on a substrate on the semiconductor device, the substrate including a substrate surface having at least one feature thereon, the at least one feature extending a feature depth from the substrate surface to a bottom surface, the at least one feature having a width defined by a first sidewall and a second sidewall, the amorphous carbon layer formed on the substrate surface, the first sidewall, the second sidewall, and the bottom surface of the at least one feature and having a conformality of greater than 30%; and
        purging the processing chamber.

2. The method of claim 1, wherein the plasma initiating gas is selected from one or more of hydrogen, helium, argon, and nitrogen.

3. The method of claim 1, further comprising repeating the deposition cycle from 2 to 50 times.

4. The method of claim 1, wherein the amorphous carbon layer is a gap fill layer.

5. The method of claim 1, wherein the amorphous carbon layer is a conformal layer.

6. The method of claim 1, wherein the hydrocarbon source comprises one or more of acetylene, vinylacetylene, benzene, styrene, toluene, xylene, pyridine, acetophenone, phenol, furan, $C_3H_2$, $C_5H_4$, monofluorobenzene, difluorobenzene, tetrafluorobenzene, and hexafluorobenzene.

7. The method of claim 1, wherein purging the processing chamber comprises flowing a purge gas into the processing chamber.

8. The method of claim 7, wherein the purge gas comprises an inert gas or a hydrocarbon source gas.

9. The method of claim 1, wherein the hydrocarbon compound to plasma-initiating gas flow ratio is from 1:10 to 10:1.

10. The method of claim 1, wherein the substrate comprises a stack of a plurality of alternating layers of an oxide material and a nitride material.

11. The method of claim 1, wherein the at least one feature comprises a memory hole or a word-line slit.

* * * * *

UNITED STATES PATENT AND TRADEMARK OFFICE
CERTIFICATE OF CORRECTION

PATENT NO. : 12,062,536 B2
APPLICATION NO. : 17/014039
DATED : August 13, 2024
INVENTOR(S) : Xiaoquan Min et al.

Page 1 of 1

It is certified that error appears in the above-identified patent and that said Letters Patent is hereby corrected as shown below:

In the Specification

•Column 3, Line 7, replace "10%, 5%" after "differing by ±14%" with "±10%, ±5%".

•Column 3, Line 8, replace "2%, or 1%" before ", would satisfy the definition" with "±2%, or ±1%".

Signed and Sealed this
Fifteenth Day of October, 2024

Katherine Kelly Vidal
*Director of the United States Patent and Trademark Office*